United States Patent [19]

Jones et al.

[11] Patent Number: 4,467,277
[45] Date of Patent: Aug. 21, 1984

[54] PROGRAMMABLE DETECTOR FOR TONE SIGNALS

[75] Inventors: Gary P. Jones, Seminole; Myles A. Larson, St. Petersburg, both of Fla.

[73] Assignee: E-Systems, Inc., Dallas, Tex.

[21] Appl. No.: 345,739

[22] Filed: Feb. 4, 1982

[51] Int. Cl.³ .............................................. G01R 23/02
[52] U.S. Cl. ................................ 324/78 R; 324/78 F; 324/78 D
[58] Field of Search ................. 324/78 R, 78 D, 78 F, 324/78 Z, 79 D; 328/133, 134

[56] References Cited

U.S. PATENT DOCUMENTS

| | | | |
|---|---|---|---|
| 2,858,425 | 10/1958 | Gordon | 324/79 D |
| 3,123,769 | 3/1964 | Meyer | 324/78 Z |
| 3,518,531 | 6/1970 | Huggett et al. | 324/78 R |
| 3,605,012 | 9/1971 | Kubanoff | 324/78 F |
| 3,710,262 | 1/1973 | Sorensen | 324/78 D |
| 4,014,242 | 3/1977 | Sanderson | 324/79 D |
| 4,021,653 | 5/1977 | Sharp et al. | 324/79 D |
| 4,119,926 | 10/1978 | Frosch et al. | 328/133 |

*Primary Examiner*—Michael J. Tokar
*Assistant Examiner*—B. J. Kelley
*Attorney, Agent, or Firm*—Albert M. Crowder, Jr.

[57] ABSTRACT

A detector circuit (10) is programmed to produce an output signal when an input signal is at a predetermined frequency. The input signal is provided to an inverter (14) to produce an inverse signal. The input signal together with the inverse signal are provided to two switches (16, 18). The switches (16, 18) are driven by first and second drive signals produced by a drive generator (60). The output terminals (24, 28) of the switches are alternately connected to the input terminals in synchronism with the corresponding drive signals. The output signals from the switches (16, 18) are transmitted through low pass filters (26, 30) and the resulting signals are combined to produce a summation signal by a summation circuit (36). The summation signal is passed through an absolute value circuit (40) to produce an absolute value signal. The absolute value signal is examined by a threshold detector circuit (44) which produces an output when the absolute value signal exceeds a preset threshold. An oscillator (52) provides a reference signal to a programmable divider (56) that produces a selected rate signal for the drive generator (60). The programmable divider (56) is set such that the selected rate signal produced thereby corresponds to the frequency of the input signal to be detected. A phase and frequency error detector circuit (60) is provided to form a feedback loop to monitor the output of the switches (16, 18) and drive the programmable divider (56) to produce a selected rate frequency signal which corresponds to the frequency of the input signal.

9 Claims, 4 Drawing Figures

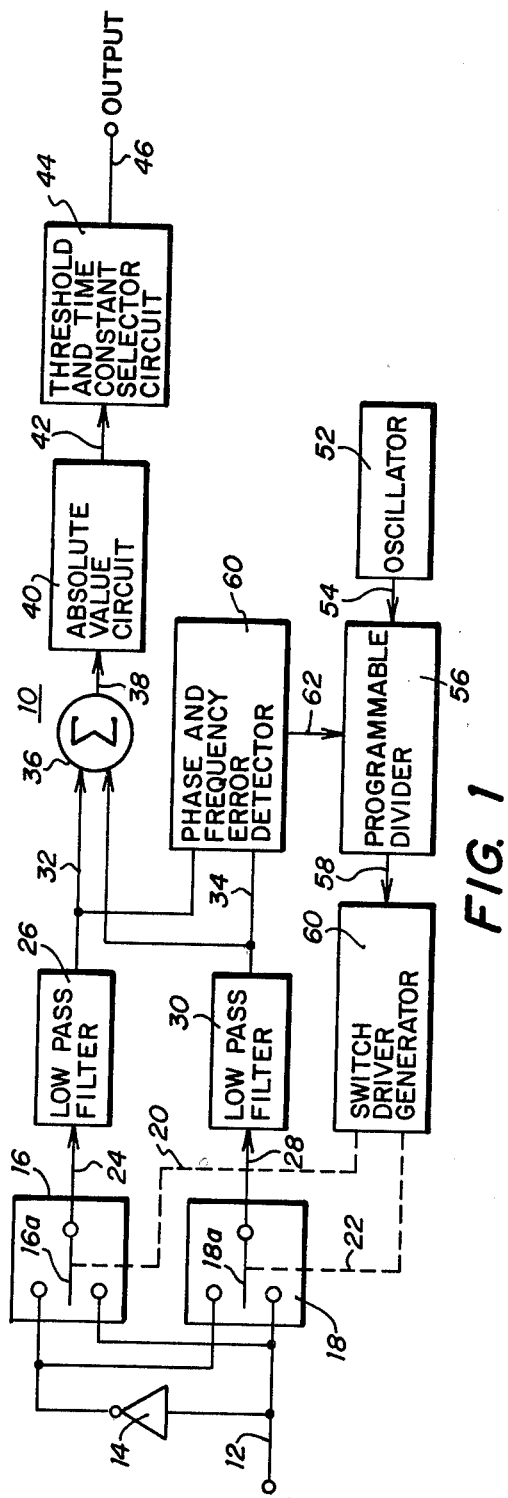
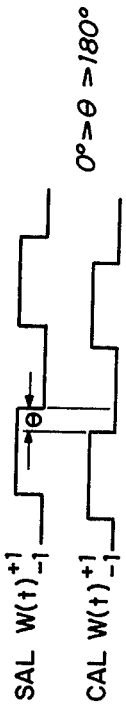
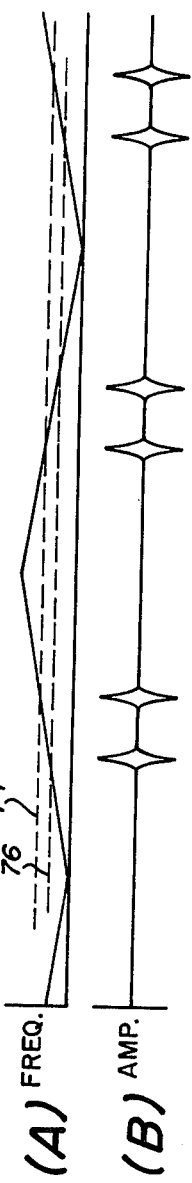
FIG. 1
FIG. 2
FIG. 3

PROGRAMMABLE DETECTOR FOR TONE SIGNALS

TECHNICAL FIELD

The present invention pertains to electronic detector circuits and more particularly to such a circuit which is programmable to detect a selected frequency signal.

BACKGROUND ART

Heretofore the methods for detecting tone signals having selected frequencies have utilized bandpass predetection filters. A high "Q" detector of this type requires a multipole filter network in which both the center frequency and the filter roll off characteristics must be highly stable and closely controlled. With multipole networks of this type it is very difficult to reprogram the center frequency. Further, it is difficult to track a dynamic signal which has frequency variations caused by Doppler shift or by other effects.

In view of these limitations there exists the need for a tone detector which has frequency stability, is highly selective, can be easily reprogrammed to detect a wide range of frequencies and further includes the capability to track a dynamic signal over a range of frequencies.

DISCLOSURE OF THE INVENTION

A method and apparatus are disclosed for detecting a tone signal having a predetermined frequency. The detector circuit includes an inverter for producing an inverse signal of an input signal. A driver generator produces first and second periodic drive signals which are orthogonal to each other. A first switch is connected to receive the input signal and the inverse signal and is operated in synchronism with the first drive signal for alternately connecting the input signal and the inverse signal to an output terminal of the first switch. A second switch is connected to receive the input signal and the inverse signal and is operated in synchronism with the second drive signal for alternately connecting the input signal and the inverse signal to an output terminal of the second switch. A low pass filter is connected to the output of each of the switches. The frequency roll off of the low pass filters determines the "Q" of the detector. A summation circuit is coupled to the output terminals of the low pass filters for summing the signals received therefrom to produce a summation signal. A detector circuit is provided to receive the summation signal and determine when the summation signal exceeds a preset threshold. The detector circuit produces an output when the input signal corresponds to the frequency of the drive signals.

BRIEF DESCRIPTION OF THE DRAWINGS

For a more complete understanding of the present invention and the advantages thereof, reference is now made to the following description taken in conjunction with the accompanying drawings in which:

FIG. 1 is a block diagram of the programmable detector of the present invention;

FIG. 2 is an illustration of the drive signal waveforms produced by the circuit shown in FIG. 1;

FIG. 3(A) is an illustration of a sweep frequency signal which serves as an input to the detector illustrated in FIG. 1; and FIG. 3(B) is an illustration of the response of a circuit comprising two detector circuits programmed for different center frequencies when activated by the signal illustrated in FIG. 3(A).

DETAILED DESCRIPTION OF THE INVENTION

Referring now to FIG. 1, there is illustrated a block diagram of a detector circuit 10 in accordance with the present invention. An input signal is received through line 12. The input signal can have a wide range of frequencies. Line 12 is connected to the input of an inverter 14 which has the output thereof connected to a first input terminal of a switch 16. The input signal also is connected directly through line 12 to a second input terminal of switch 16.

The output of inverter 14 is also connected to a first input of a switch 18. A second input to switch 18 is connected to line 12 to receive the input signal. Note that each of the switches 16 and 18 receive both the input signal and the inverse of the input signal.

The switch element 16a of switch 16 is driven by a first drive signal which is received through a control line 20. The switch 18 includes a switch element 18a which is operated by a second drive signal which is received through a line 22. The switches 16 and 18 together with the switch elements therein are illustrated schematically to show the function of the switch. In the preferred embodiment of the invention the switching is carried out electronically rather than mechanically as functionally illustrated.

The output terminal of switch 16 is connected through a line 24 to a low pass filter 26. Likewise the output of switch 18 is connected through a line 28 to a low pass filter 30.

Output terminals 32 and 34 of the filters 26 and 30 respectively are connected to the inputs of a summation circuit 36. The summation circuit 36 produces a summation signal which is transmitted through a line 38 to an absolute value circuit 40.

The absolute value signal produced by circuit 40 is transmitted through a line 42 to a threshold and time constant selector circuit 44. Threshold circuit 44 produces an output signal on an output line 46 when the absolute value signal received by the circuit 44 exceeds a preset threshold.

The first and second drive signals described above are derived from a reference signal produced by an oscillator 52. The reference signal is transmitted from the oscillator 52 through a line 54 to a programmable divider 56. The divider 56 includes conventional countdown circuitry for producing a selected rate signal which is transmitted through a line 58. The selected rate signal is received by a switch driver generator 59 which produces the first and second driver signals that are transmitted through lines 20 and 22 to operate the switches 16 and 18, respectively.

A phase and frequency error detector 60 receives the output signals from filters 26 and 30 through lines 32 and 34. Detector 60 generates an error signal which is transmitted through a line 62 to the programmable divider 56 for controlling the rate of the signal produced by the divider. Detector 60 is included as a part of the present invention when it is required that the input signal be tracked over a range of frequencies. In other applications the detector 60 can be omitted and the divider 56 can be set to an operating frequency.

The first and second driver signals are illustrated in FIG. 2 in which the first driver signal is shown by the term SAL w(t) and the second driver signal is shown by the term CAL w(t). The driver signals are shown as bi-level signals having +1 and −1 states in which the corresponding switch arm is driven to a connection with the first input terminal when the drive signal is in the +1 state and is driven for connection to the second input terminal when the drive signal is in the −1 state. Note that the driver signals are periodic square waves which are phase offset by an angle $\theta$. The drive signals are defined by the following relationships.

SAL $(\mu, \theta)$ and CAL $(\mu, \theta)$

In their general form these functions form the four parameters of amplitude V, frequency $\phi$, delay $\tau$, and time base T.

Utilizing the substitutions:
$\phi = \mu/t$ and
$\tau = \phi T$
yields:
V SAL $[\phi T, t-t_0/T]$ and
V CAL $[\phi T, t-t_0/T]$
The orthogonal functions of interest are:
SAL $(\mu, \theta)$ $0 < \mu \leq 1$
CAL $(\mu, \theta)$ $1 \leq \mu < 2$
These drive signals are further defined in the book "Transmission of Information by Orthogonal Functions" by Henning F. Harmuth, Copyright 1969 by Springer-Verlag, Berlin-Heidelberg, West Germany, published by Springer-Verlag New York, Inc. This book is herein incorporated by reference.

Operation of the detector circuit of the present invention is now described in reference to FIGS. 1 and 2. The oscillator 52 produces a stable reference signal which is provided to the programmable divider 56. This divider is set to produce a selected rate signal which is at the frequency to be detected for the input signal. The selected rate signal is provided to the driver generator 50 which produces the first and second drive signals as described above. These drive signals operate switches 16 and 18. For each switch the output terminal is alternately connected to receive the input signal and then to receive the inverse signal of the input signal. Due to the phase offset of the drive signals the switches 16 and 18 are not necessarily operated to switch inputs at the same time.

The output from the switch 16 is transmitted to a low pass filter 26 which serves to eliminate extraneous high frequency components, such as those introduced by the switching operation. The low pass filter 30 provides a similar function for the output signal from the switch 18.

The signals which pass through the low pass filters 26 and 30 are combined to produce a summation signal by operation of the summation circuit 36. The absolute value of the summation signal is then produced by the absolute value circuit 40. The absolute value signal is provided to the threshold circuit 44 which produces an output when the absolute value signal exceeds a preset threshold.

The phase and frequency error detector 60 receives the signals transmitted through the low pass filters 26 and 30. Detector 60 is connected to form a feedback loop. The detector 60 examines the phase of the signals received therein to determine the frequency offset of the drive signal from the frequency of the input signal. The signals received over lines 32 and 34 by the detector 60 will have a greater frequency for greater offset from the frequency of the driver signals. The detector 60 produces an error signal which is transmitted through line 62 to the programmable divider 56. The detector 60 drives the programmable divider 56 to change the frequency of the selected rate signal produced by the divider to reduce the frequency of the error signal received by the detector 60. When the phase and frequency offset received by detector 60 reaches zero, the error signal will provide no additional drive to the programmable divider 56 which is then at the state of producing a selected rate signal having the same frequency as the input signal. The detector circuit 60 thus provides a means for tracking a dynamic input signal which has a changing basic frequency. A primary cause of such frequency change is Doppler shift due to the movement of aircraft and space vehicles. The dynamic tracking also compensates for the drift in transmitted carrier frequencies. In applications where it is not desired to provide such a tracking of the input signal, the detector 60 is not implemented and the divider 56 is programmed to produce a signal at a predetermined rate for detection of input signals having a corresponding rate.

The signals produced and used with an apparatus which employs the detector of the present invention are illustrated in FIG. 3. The apparatus (not shown) which produces the output signal shown in FIG. 3(B) comprises a set of two of the decoders illustrated in FIG. 1. An example input to the apparatus is the signal illustrated in FIG. 3(A). This is a sweep frequency signal in which the input signal increases and decreases at a linear rate. The programmable dividers for the two decoders are set to different frequencies. The first frequency corresponds to the frequency of the input signal shown by line 74. The second decoder is programmed to respond to the frequency shown by the line 76. Note that the input signal illustrated in FIG. 3(A) passes through the programmed signals twice during each cycle. The outputs of the two decoders are combined into a single signal which is illustrated in FIG. 3(B). Note that one of the decoders produces a response each time the input signal passes through the frequency illustrated by line 74 and the other decoder produces an output each time the input signal passes through the frequency represented by the line 76.

A further application of the detector of the present invention is in the detection of dual frequency tones as used in a tone dialing telephone system. A pair of the decoders 10 can be programmed for each of the pairs of signals which represent a digit for a tone dialing system. By combining the output of a pair of such detectors with the logic circuitry, an output can be produced when a particular dual tone signal is provided as an input.

In summary, the present invention comprises a decoder for detecting an input signal having a predetermined frequency. The input signal together with its inverse are provided as inputs to two separate switch circuits which are driven by periodic, bi-level drive signals having a predetermined phase offset. Each of the switches is operated by the corresponding drive signal to alternately connect one of the two inputs to the output terminal. The output signals from the switches are filtered and combined in a summation circuit to produce a summation signal. The summation signals coupled to a threshold detector to produce an output signal when the summation signal exceeds a preset threshold. Feedback circuitry is provided for detecting the phase and frequency of the outputs of the switches to vary the frequency of the drive signals if it is desired to track a shifting frequency input signal. The decoder can be rapidly programmed to respond to input signals having substantially separated frequencies.

Although one embodiment of the invention has been illustrated in the accompanying drawings and described in the foregoing Detailed Description, it will be understood that the invention is not limited to the embodiment disclosed, but is capable of numerous rearrangements, modifications and substitutions without departing from the scope of the invention as defined by the following claims.

We claim:

1. A detector circuit comprising,
  first and second switch means;
  means for generating an inverse signal of an input signal;
  means for generating first and second periodic drive signals, said drive signals orthogonal to each other;
  means for connecting said first and second drive signals to said first and second switch means, respectively;
  said first switch means including first and second input terminals, said first input terminal connected to receive said input signal and said second input terminal connected to receive said inverse signal, said first switch means operated in synchronism with said first drive signal for alternately connecting said input signal and said inverse signal to an output terminal of said first switch means;
  said second switch means including first and second terminals, said first input terminal of said second switch means connected to receive said input signal and said second input terminal of said second switch means connected to receive said inverse signal, said second switch means operated in synchronism with said second drive signal for alternately connecting said input signal and said inverse signal to an output terminal of said second switch means;
  means coupled to said output terminals of said first and second switch means for summing the signals received therefrom to produce a summation signal; and
  means for detecting when said summation signal exceeds a preset threshold.

2. The detector circuit recited in claim 1 including a low pass filter connected between each of said output terminals and each of the corresponding input terminals of said means for summing.

3. The detector circuit recited in claim 1 including an absolute value circuit connected between said means for summing and said means for detecting.

4. The detector circuit recited in claim 1 including a phase and frequency detector circuit coupled to said output terminals and connected to said means for generating drive signals for adjusting the frequency of said drive signals to correspond to the frequency of said input signal.

5. The detector circuit recited in claim 1 wherein said means for generating comprises:
  an oscillator for generating a reference signal;
  a programmable divider connected to receive said reference signal and generate therefrom a selected rate signal; and
  signal generator means connected to receive said selected rate signal for generating said first and second drive signals as periodic, bi-level signals having the same rate and a preset phase differential.

6. A method for detecting an input signal having a selected frequency, comprising the steps of:
  generating an inverse signal of an input signal;
  generating first and second periodic, bi-level drive signals at a frequency corresponding to said selected frequency and having a predetermined phase differential;
  alternately connecting said input and inverse signals to a first terminal as a function of a state of said first drive signal;
  alternately connecting said input and said inverse signals to a second terminal as a function of a state of said second drive signal;
  measuring the phase and frequency of the signals received from said first and second terminals;
  altering the frequency of said first and second drive signals in response to said measuring to cause the frequency of said drive signals to correspond to the frequency of said input signal;
  summing the signals received at said first and said second terminals to produce a summation signal; and
  detecting when said summation signal exceeds a predetermined threshold to indicate that said input signal is at said selected frequency.

7. The method recited in claim 6 including the step of low pass filtering the signals received through said first and second output terminals.

8. The method recited in claim 6 including the step of taking the absolute value of said summation signal before the step of detecting said summation signal.

9. The method recited in claim 6 wherein the step of generating first and second drive signals comprises the steps of:
  generating a reference signal;
  dividing the rate of said reference signal to produce a selected rate signal; and
  generating said first and second drive signals as a function of said selected rate signal.

* * * * *